United States Patent
Riley, Jr. et al.

(10) Patent No.: US 6,370,405 B1
(45) Date of Patent: Apr. 9, 2002

(54) FINE UNIFORM FILAMENT SUPERCONDUCTORS

(75) Inventors: Gilbert N. Riley, Jr.; Qi Li, both of Marlborough; Peter R. Roberts, Groton; Peter D. Antaya, Sutton, all of MA (US); Jeffrey M. Seuntjens, Singapore (SG); Steven Hancock, Worcester, MA (US); Kenneth L. DeMoranville, Jefferson, MA (US); Craig J. Christopherson, Worcester, MA (US); Jennifer H. Garrant, Natick, MA (US); Christopher A. Craven, Bedford, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 08/902,421

(22) Filed: Jul. 29, 1997

(51) Int. Cl.⁷ .......................... H01B 12/02; B32B 15/04
(52) U.S. Cl. ................ 505/231; 505/236; 505/237; 505/431; 505/704; 174/125.1; 29/599; 428/702; 428/930
(58) Field of Search ............................. 505/230, 231, 505/232, 236, 237, 430, 431, 432, 433, 434, 704; 174/125.1; 29/599; 428/373, 374, 378, 389, 697, 702, 930

(56) References Cited

U.S. PATENT DOCUMENTS

| | | | |
|---|---|---|---|
| 4,994,435 A | 2/1991 | Shiga et al. ................ 505/1 |
| 5,079,224 A | 1/1992 | Higuchi ........................ 505/1 |
| 5,093,314 A | 3/1992 | Takahashi et al. .......... 505/1 |
| 5,122,507 A | 6/1992 | Yamamoto et al. ......... 505/1 |
| 5,151,406 A | 9/1992 | Sawada et al. .............. 505/1 |
| 5,187,149 A * | 2/1993 | Jin et al. .................... 505/450 |
| 5,210,071 A | 5/1993 | Loiacono et al. ............ 505/1 |
| 5,231,074 A | 7/1993 | Cima et al. .................. 505/1 |
| 5,232,908 A | 8/1993 | Shiga et al. .................. 505/1 |
| 5,284,825 A | 2/1994 | Stephens et al. ............ 505/1 |
| 5,347,085 A * | 9/1994 | Kikuchi et al. ............ 505/231 |
| 5,395,821 A | 3/1995 | Kroeger et al. ............ 505/431 |
| 5,508,254 A | 4/1996 | Sato et al. .................. 505/433 |
| 5,898,021 A * | 4/1999 | Tenbrink et al. ........... 505/433 |

OTHER PUBLICATIONS

Q. Li et al., Physica C, 217 (1993) 360–366. (No Month).
Dorris, S.E., Ashcom, N., and Vasanthamohan, N. in an Argonne National Laboratory 01/98 Superconductor Development Quarterly Progress Report (US Dept of Commerce—NTIS).
Woolf, L.D., et al., Appl. Phys. Let. 58 534–536, Feb. 1991.
Okada et al., "Fabrication of Ag–Sheathed Ba–Y–Cu Oxide Superconductor Tape," Japanese Journal of Applied Physics, Feb. 1988, vol. 27, No. 2, pp. L185–L187.

* cited by examiner

*Primary Examiner*—Marie Yamnitzky
(74) *Attorney, Agent, or Firm*—Hale and Dorr LLP

(57) ABSTRACT

A multifilamentary superconductor composite having a high fill factor is formed from a plurality of stacked monofilament precursor elements, each of which includes a low density superconductor precursor monofilament. The precursor elements all have substantially the same dimensions and characteristics, and are stacked in a rectilinear configuration and consolidated to provide a multifilamentary precursor composite. The composite is thereafter thermomechanically processed to provide a superconductor composite in which each monofilament is less than about 50 microns thick.

36 Claims, 8 Drawing Sheets

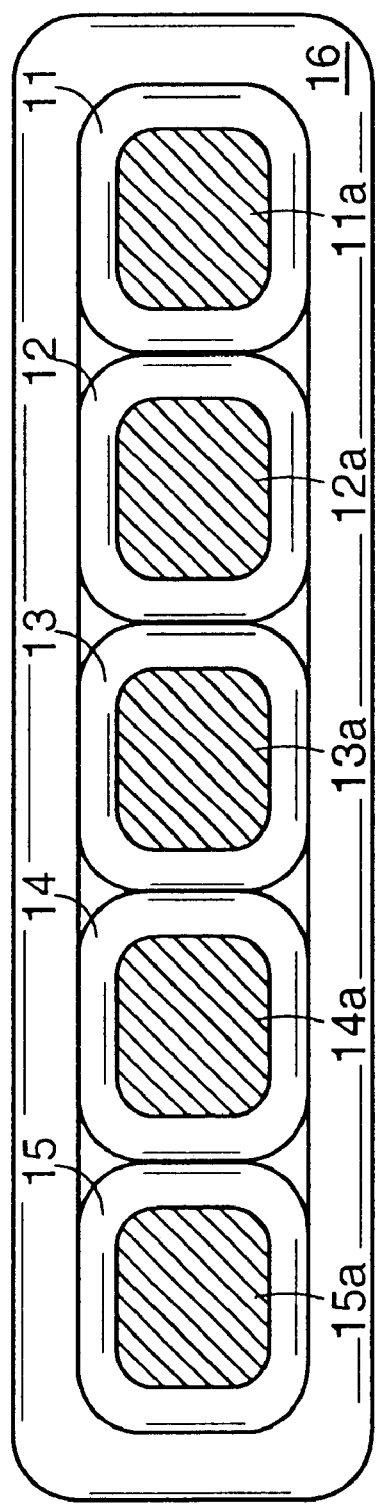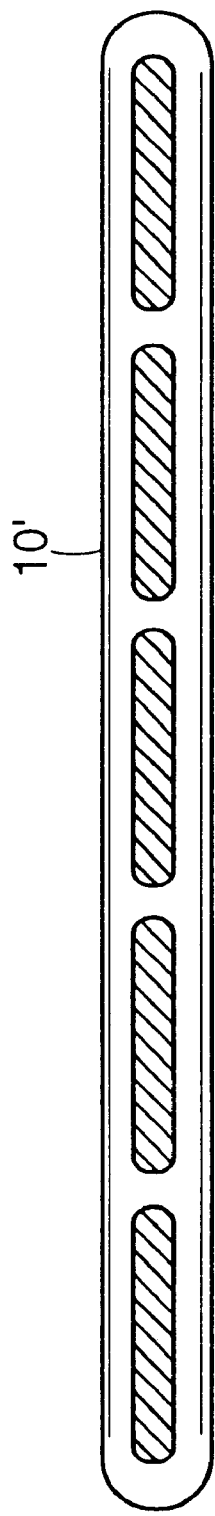
FIG. 1
FIG. 1a

FINE UNIFORM FILAMENT SUPERCONDUCTORS

GOVERNMENT RIGHTS

This invention was made with Government support under Contract No. DE-FG02-96ER82121 awarded by the Department of Energy. The Government has certain rights in this invention.

FIELD OF THE INVENTION

This invention relates to high temperature ceramic superconductors. More particularly, it relates to multifilamentary superconductor structures that include a multiplicity of thin and uniform filaments; and to the manufacture of such structures from near net shape precursors.

BACKGROUND OF THE INVENTION

Superconductors are materials having essentially zero resistance to the flow of electrical current at temperatures below a critical temperature, Tc. A variety of copper oxide ceramic materials have been observed to exhibit superconductivity at relatively high temperatures, i.e., above 77K. Since the discovery of the first copper oxide based superconductor about ten years ago, these superconducting ceramics have attracted wide interest, and their physical and chemical properties have been widely studied and described in many publications.

Composites of superconducting materials and metals are often used to obtain better mechanical and electrical properties than superconducting materials alone provide. These composites are typically prepared in elongated wires, elements and cables by a variety of known processes such as the well-known powder-in-tube ("PIT") process in which a metal container is filled with a precursor powder and the filled container is then deformed and thermomechanically processed to form filamentary composites having the desired superconducting properties, and a variety of coated conductor ("CC") processes in which a superconductor material or a precursor thereof is deposited on a substrate which is then further processed to form a composite including a superconducting filament. However formed, a multiplicity of filaments may be bundled and/or cabled, with additional deformation and thermomechanical processing steps as needed, to provide multifilamentary composites.

To be commercially viable, high-temperature superconductor (HTS) wire must have high performance (e.g., high critical current density of the superconductor, Jc) and low cost. In the past, considerable efforts have been directed to improving the Jc of superconducting ceramics through densification and crystallographic alignment or texture of the superconducting grains; more recently, there has been increasing interest in and efforts to develop manufacturing technologies through which long lengths of HTS wires can be fabricated with higher, and commercially acceptable, price to performance (as measured by $/kA m) ratios.

At this time, it is known in the HTS community that the highest performing BSCCO (both 2212 and 2223) contain highly aspected (an "aspected" element has, in transverse cross-section, a width greater than its height) filaments with dimensions on the order of 10 ×100 microns, and that composite Bi-2223 conductors fabricated using PIT techniques can achieve relatively high Jc performance if asymmetric deformation resulting in an aspected element is employed. For example, using asymmetric deformation, a Jc value of 69,000 A/cm2 at 77K and self field has been reported (Q. Li et al., Physica C, 217 (1993) 360); and it has been predicted that the Jc performance of Bi-2223 conductors may be improved drastically if the thickness of the superconducting layer is decreased from the 30 micron level used by Li et al. to the three micron level. A Jc value in excess of 100,000 A/cm2 (77K, 0 T) has been estimated for the Bi-2223 layer (about 1.5 micron thick) that is immediately adjacent to the Ag in conventionally fabricated elements. Other HTS wire types have shown short length performance, e.g., coated conductors based on Y-123 which are fabricated using thin film techniques using such equipment as vacuum systems, lasers and ion guns.

It is difficult to achieve filament thicknesses in the range of 3 microns using conventional PIT techniques in which axisymmetric deformation is used to prepare a round multifilamentary precursor that is subsequently rolled into a highly aspected element, for two principal reasons. First, the strain path for each filament is a function of its position within the composite, and filaments in the edges of the final element will be less textured and will have a lower performance level than those in the central region of the element. Second, the pre-deformation cross-section of each filament is typically circular, and it is difficult to achieve a thin and wide filament by deforming an initially round filament.

A variety of deformation processing procedures have been proposed. Copending application Ser. No. 08/468,089, filed Jun. 6, 1995 now U.S. Pat. No. 6,247,224 entitled "Simplified Deformation-Sintering Process for Oxide Superconducting Articles", and incorporated herein by reference in its entirety, describes a method for preparing a highly textured oxide superconductor article in a single, rather than a multiple step, deformation-sinter process. In the procedure described a precursor article, including a plurality of filaments extending along the length of the article and comprising a precursor oxide having a dominant amount of a tetragonal BSCCO 2212 phase and a constraining member substantially surrounding each of the filaments, is subjected to a heat treatment at an oxygen partial pressure and temperature selected to convert a tetragonal BSCCO 2212 oxide into an orthorhombic BSCCO 2212 oxide. Thereafter, the article is roll worked in a single high reduction draft in a range of about 40% to 95% in thickness so that the filaments have a constraining dimension is substantially equivalent to a longest dimension of the oxide superconductor grains, and is then sintered to obtain a BSCCO 2212 or 2203 oxide superconductor. Other procedures are disclosed in copending application Ser. No. 08/651,688, filed Nov. 11, 1995 and entitled "Improved Breakdown Process for Superconducting Ceramic Composite Conductors", which application is also here incorporated by reference in its entirety.

To be practical outside the laboratory, most electrical and magnetic applications require flexible cabled lengths of conductor manufacturable with high fill factors (i.e. a high volume percent of superconductor in the composite multifilament structure) in addition to high current-carrying capacity. Thus, in addition to making individual filaments with high Jc, considerable effort also has been directed to the manufacture of cables and the like which include a multiplicity of HTS filaments. For example, copending application Ser. No. 08/554,814, filed Nov. 11, 1995, now U.S. Pat. No. 6,247,225, entitled "Cabled Conductors Containing Anisotropic Superconducting Compounds and Method for Making Them," and also hereby incorporated by reference in its entirety, discloses a cabled conductor comprising a plurality of transposed strands each comprising one or more preferably twisted filaments preferably surrounded or supported by a matrix material and comprising textured anisotropic superconducting compounds which have crystallographic grain alignment that is substantially unidirectional and independent of the rotational orientation of the strands and filaments in the cabled conductor. The cabled conductor is made by forming a plurality of suitable composite strands, forming a cabled intermediate from the strands by transposing them about the longitudinal axis of the conductor at a preselected strand lay pitch, and, texturing the strands in one or more steps including at least one step involving application of a texturing process with a primary component directed orthogonal to the widest longitudinal cross-section of the cabled intermediate, at least one such orthogonal texturing step occurring subsequent to said strand transposition step. In one embodiment, the filament cross-section, filament twist pitch, and strand lay pitch are cooperatively selected to provide a filament transposition area which is always at least ten times the preferred direction area of a typical grain of the desired anisotropic superconducting compound. For materials requiring biaxial texture, the texturing step may include application of a texturing process with a second primary component in a predetermined direction in the plane of the widest longitudinal cross-section of the conductor.

Others, e.g., U.S. Pat. 5,508,254, have proposed forming a multifilamentary structure by vertically stacking relatively thick rolled tapes.

However, and despite all of the past and ongoing work in the field, both cost and performance are still major constraints limiting the widescale use of HTS wires in the marketplace. There remain the needs to increase the Jc of HTS filaments, to provide multi-filament composites of varying geometry having greater fill factors and overall current-carrying capacity, and to accomplish all of this at reduced cost.

SUMMARY OF THE INVENTION

The invention features a multi-filamentary superconductor having a high fill factor (e.g., greater than 30% and preferably greater than 35% to 40%) which is made in a semi-continuous procedure from a number of superconductor precursor elements, each of which has substantially the same overall geometry and which include superconductor precursor monofilaments having the same overall configuration. The superconductor precursor monofilaments are provided on or in a metal component. Before rolling, the precursor monofilaments have a low density (i.e., in the range of 25 to 70 percent, preferably 30–65 percent, and most preferably 40 to 60 percent, theoretical density); after rolling, the thickness of the monofilaments is not more than about 50 microns (and preferably not more than about 40 microns). The elements are consolidated into a composite in which the spatial relationship of the elements is such that all of the elements are symmetric relative to each other and also both to the external shape of the composite and to subsequent deformation. In the consolidated precursor composite, metal components of the composite form a bonded ladder structure with superconductor precursor monofilaments in the space between adjacent "rungs". Both before and after consolidation the configurations of the filaments of the different precursor elements are substantially the same.

As used herein, "precursor" means any material that can be converted to a desired anisotropic superconductor upon application of a suitable heat treatment. If the desired anisotropic superconductor is an oxide superconductor, for example, precursors may include any combinations of elements, metal salts, oxides, suboxides, oxide superconductors which are intermediate to the desired oxide superconductor, or other compounds which, when reacted in the presence of oxygen in the stability field of a desired oxide superconductor, produces that superconductor. Whatever the particular precursor, in the practice of the present invention, the final aspect ratio of the composite, and of the superconductor monofilaments in it, may be decoupled from the aspect ratios of the individual precursor elements and superconductor precursor filaments.

"Consolidate", as used herein, means to carry out operations that allow an assembly of elements to behave as a unit, at least to the extent that there is no large scale displacement of various elements of the assembly (e.g., the precursor composite) during subsequent processing. Consolidation may be accomplished by a number of procedures including heat treatment (thermal processing), chemical adhesion, and drawing or other deformation processes. The preferred procedure includes sufficient thermal heating to accomplish an initial phase transition of the superconductor precursor.

In one aspect of this invention, the composite precursor includes a number of precursor elements, each of which includes at least one HTS precursor monofilament, stacked in side by side alignment to form a layer in which the tops and bottoms of the elements and also the filaments in the elements are generally aligned across the width of the composite. Metal (typically a noble metal although other metals, with a buffer layer as required to prevent interreaction with the superconductor components, may also be used) is provided between each adjacent pair of precursor filaments. In embodiments of this aspect, the composite may include more than one layer of side-by-side precursor elements, in which event the layers are stacked vertically in such a way that each HTS precursor filament is either in vertical alignment with or is centered on the thin space between HTS precursor filaments in any other layer. All the HTS precursor filaments in the different precursor elements have essentially the same aspect ratio, width and thickness. The stacked composite structure typically is provided with a surrounding metal wrap or sheath and heated to consolidate its various components.

In a second aspect of the present invention, each precursor element includes metal having a layer of an HTS precursor deposited on at least one face of the metal, and preferably on both of its opposite faces, and in the composite metal overlies both an otherwise exposed face and the side edges of each of the HTS precursor layers.

In preferred practices of the invention, precursor composites are thermomechanically processed in a 1DS or 2DS procedure (as discussed hereinafter) in which the element is reduced by about 40% to about 95% in thickness (with no subsequent reduction in thickness in excess of about 5% prior to a sintering step), and the thus-rolled precursor composite is sintered to obtain a final superconductor composite structure having effectively uniform filaments. In high performance structures, the HTS filaments are typically less than about 10 microns, preferably in the range of about 2–7 microns, and most preferably about 5 microns, thick.

Preferred precursor composites are made in PIT or coated conductor processes in which a plurality of effectively identical superconductor precursor elements having low density HTS precursor monofilaments are (after drawing but before rolling for PIT elements) stacked and surrounded with a supporting fine-grain metal. In each precursor element, the HTS precursor filament is on or in a fine grain metal. In PIT processes, the element is drawn to smaller size in a procedure involving frequent anneals to maintain the fine grain size and deformation characteristics of the metal. By "fine-grained" is meant an average grain size that is typically less than 300 micrometers, preferably less than 200 micrometers, more preferably less than 100 micrometers, even more preferably less than 50 micrometers, or, most preferably less than 20 micrometers. The maximum grain size is typically less than about 300 micrometers, preferably less than about 200 micrometers, more preferably less than about 100 micrometers, and most preferably less than about 50 micrometers. The stacked precursor elements and support are then consolidated and thermomechanically processed. The precursor elements may be made using a PIT process in which each element is made from a metal tube filled with precursor powder to a low density which then has been drawn to provide a structure not more than about 600 microns in diameter and in which the superconductor precursor monofilament is of low density and not over about 300 microns thick. Such drawn elements may then be rolled into high aspect ratio elements, which depending on the procedure used may result in high density HTS precursor filaments. The precursor elements also may be made using a deposition/coating process in which each element comprises a fine-grain metal substrate carrying a low density precursor superconductor layer. In the latter event, a precursor superconductor layer is preferably provided on both sides of the substrate, and the composite precursor includes fine grain metal between adjacent precursor elements.

DESCRIPTION OF THE DRAWINGS

The foregoing and other objects, features and advantages of the invention will become more apparent from the following detailed description of preferred embodiments thereof, taken together with the attached drawings in which:

FIGS. 1 and 2 are cross-sections of composite superconductor precursor structures according to the present invention;

FIGS. 1a and 2a are cross-sections of multifilamentary superconductor structures made from, respectively, the precursor structures of FIGS. 1 and 2.

DESCRIPTION OF PREFERRED EMBODIMENTS

Figure 2:
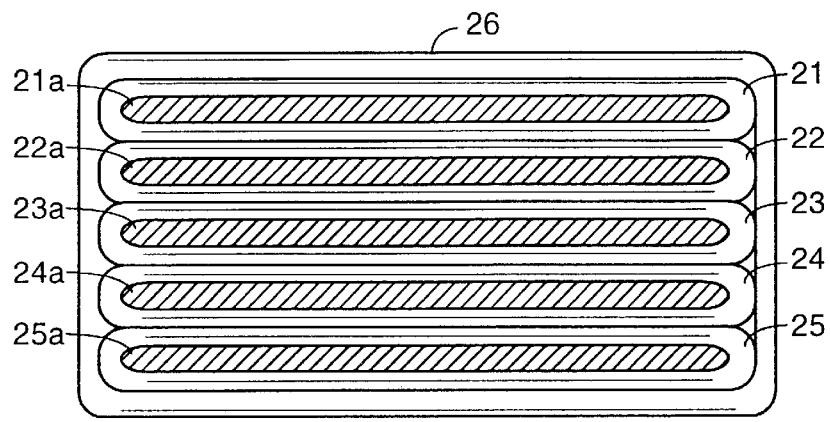
Figure 2A:
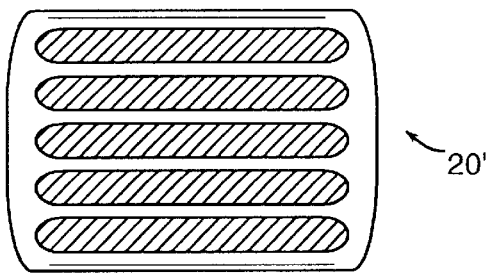

FIGS. 1 and 2 illustrate exemplar superconductor precursor composite structures, designated 10 and 20, each of which includes a plurality of HFM precursor monofilament elements, designated 11 through 15 and 21 through 25, respectively. Each element has an HIS precursor monofilament, designated 11a through 15a and 21a through 25a, respectively; and in each of the composites all of the elements and all of the monofilaments have substantially the same size and cross-sectional configuration. It will also be noted that, in each composite structure 10 and 20, there is a metal, e.g., a noble metal such as Ag, layer 16, 26 between each adjacent pairs of HTS precursor monofilaments. As discussed hereinafter, the Ag layer 16, 26 may, in the case of an element formed by a PIT process, be provided by the sheath used in the process. In other circumstances, e.g., when the HTS precursor filament is formed on a metal substrate, some portions of the Ag between adjacent filaments may be provided by separate spacers.

As used herein, the term "noble metal" means a metal which is substantially non-reactive with respect to oxide superconductors and precursors and to oxygen under the expected conditions (temperature, pressure, atmosphere) of manufacture and use. Preferred noble metals include silver, gold, platinum and palladium. Silver (Ag) and its alloys, being lowest in cost of these materials, are most preferred for large scale manufacturing. It should be noted that in some circumstances the noble metal may also be a stoichiometric excess of one of the metallic elements of the desired superconducting ceramic, such as copper. It should also be noted that, although noble metals such as Ag are preferred, other deformable metals may be used, particularly as substrates on which superconductor precursors are deposited. The use of metals such as nickel, certain nickel alloys or stainless steel, often with an oxide buffer layer, is known in the art. See, e.g., U.S. Pat. No. 5,284,825.

It will be evident that the particular superconductor ceramic of which the HTS monofilaments are precursors is not critical. For example, superconducting ceramics of the oxide, sulfide, selenide, telluride, nitride, boron carbide or oxycarbonate types may be used. Superconducting oxides, e.g., members of the rare earth (RBCO) families of superconductors, the bismuth (BSCCO) family of oxide superconductors, the thalliium (TBSCCO) family of oxide superconductors, of the mercury (HBSCCO) family of superconductors, are preferred. The bismuth and rare earth families are most preferred. Thallinatioin, the addition of doping materials, variations from ideal stoichiometric proportions and other variations in the formulation of the desired superconducting oxides may also be used in manners similar to those now known to the art. At present, it appears that BSCCO materials (either 2212 or 2223) and YBCO materials are the most viable materials for use in HTS electrical systems, and the presently most preferred materials are BSCCO 2223 and YBCO 123. It will be appreciated that the compositions of the BSCCO, YBCO and other materials are well-known in the art, as are procedures for making of superconductor precursors employing these materials, and for thermomechanically treating the precursors to produce the desired superconductor from the precursor. See, e.g., the aforementioned '089 and '814 applications, and the various patents and publications referred to therein.

As shown in FIG. 1, the drawn (but not yet rolled) precursor elements 11 through 15 of precursor composite 10 are generally square in cross section and about 600 microns in overall thickness and width. The superconductor precursor filaments 11a through 15a in each element has a low density (e.g., less than about 60% of theoretical density) and an overall thickness of about 300 microns (e.g., the thickness of the monofilament is about half the overall thickness of the entire precursor element. The five elements 11 through 15 are stacked side-by-side, with the tops and bottoms of all of the elements lying in substantially the same respective parallel planes and the HTS precursor filaments similarly aligned. The principal axes of the filaments are parallel to those of the composite, and to the principal displacements and loads of subsequent deformations. Although the composite 10 of FIG. 1 includes five side-by-side generally square precursor elements; it will be evident that different composites may include different numbers of precursor elements similarly arranged side-by-side, and that the precursors may be aspected, whether of high or low density. Typically a composite having this side-by-side precursor element geometry will include between about 5 and about 20 precursor elements across its width; as discussed hereinafter with respect to FIG. 9, it will be apparent that composites constructed in accord with the present invention may include a number of vertically stacked layers, each of which includes a number of a side-by-side elements as shown in FIG. 1.

By way of further example, the precursor elements 21 through 25 of precursor composite 20 of FIG. 2 have been rolled so that they have a high aspect ratio (i.e., they have a width that is at least twice and typically several times the thickness). Before rolling, the dimensions and density of the filaments of elements 21 through 25 were substantially the same as those of elements 11 through 15. After rolling, each of elements 21 through 25 is not more than about 100 microns thick, the monofilaments 21*a* through 25*a* within the respective elements are not more than about 50 microns thick, and the monofilaments have a relatively high density. As shown in FIG. 2, elements 21 through 25 are stacked vertically, with the opposite side edges of all of the elements generally aligned with each other, and the tops and bottoms of the elements, and of the precursor filaments 21*a* through 25*a* of the elements, generally parallel. The composite 20 of FIG. 2 includes five vertically stacked elements, but it will be evident that other composites may have different numbers. Typically, a composite having this vertically stacked, aligned edges, precursor element geometry will include between 2 and 10 vertically stacked layers.

No matter what particular stack arrangement may be used, the dimensions of the precursor elements and the arrangement of the elements in the stack is such that the aspect ratio (i.e., height:width) of the stack is not greater than one (1). The stacked elements are consolidated and thereafter thermomechanically processed (as discussed hereinafter and typically using procedures known in the art) to produce the final desired multifilamentary superconductor, e.g., the multifilamentary superconductor 10' shown in FIG. 1*b* that is produced from a precursor composite such as composite 10, or the multifilamentary superconductor 20' shown in FIG. 2*b* that is produced from a precursor composite such as composite 20. With a too high aspect ratio it difficult to accomplish further processing while maintaining the integrity of and arrangement of elements in the composite. As shown in FIGS. 1 and 2, and also as discussed in more detail hereinafter, the elements of the respective composite are typically surrounded by some metal, e.g., a noble metal such as Ag, elements 16, 26, that support and locate the elements relative to each other, at least until such time as the elements have been consolidated.

Figure 3:
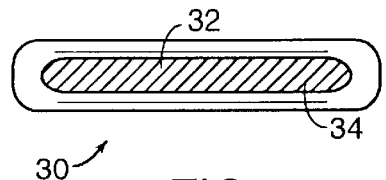
FIG. 3 is a cross-section of a monofilament precursor element made using a PIT procedure for use in the practice of the present invention.
Figure 4:
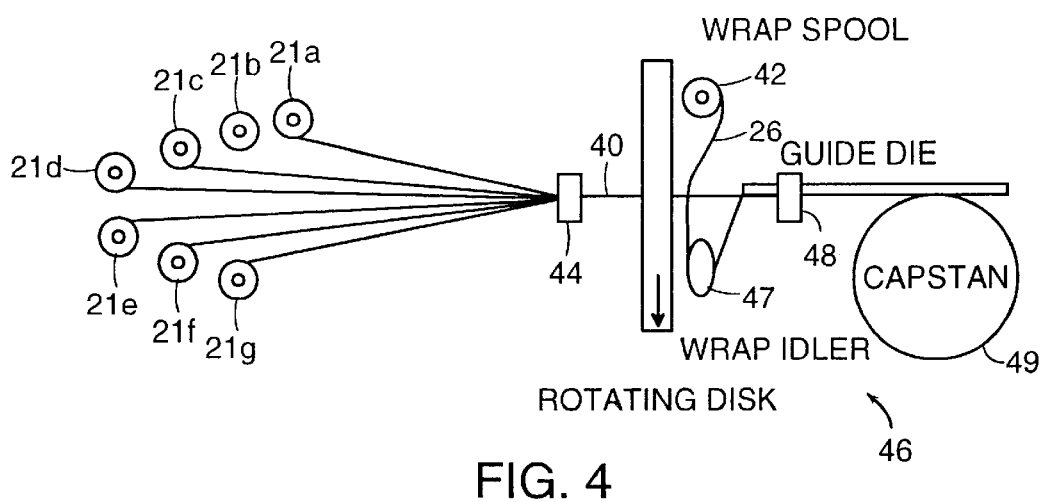
FIG. 4 is a schematic illustrating a procedure for forming the composite of FIGS. 1 and 2.

Reference is now made to FIGS. 3 and 4 which illustrate certain aspects of the manufacture of superconductor precursor composites such as those of FIGS. 1 and 2 from monofilament precursor elements made according to a PIT process.

As is well-known, in PIT processes a round wire by (a) forming a powder of the superconductor precursor material, (b) filling a metal container such as a tube, billet or grooved sheet with the precursor powder, and (c) deformation processing the filled container to provide a composite of reduced cross-section that includes a filament of the superconductor precursor in a surrounding metal matrix. In the instant invention, the matrix must be a fine-grained metal, and the deformation processing typically includes a number of successive draws in which the diameter of the wire is reduced to, e.g., about 0.3 to 0.6 mm with a fill factor of, nominally, 47%. The drawn wire is then annealed (erg., at 300C for about 30 minutes) one or more times in the course of drawing to recrystallize the Ag sheath, and further softened (e.g., at above 450 C for over a half hour). The purpose of the anneals is to soften the noble metal without creating excessive grain growth, thereby to maintain the fine grains of the noble metal throughout drawing (and any subsequent rolling) of the monofilament element. Typically, the element is annealed sufficiently frequently that the applied strain on the element does not exceed one (1) before another anneal is performed. Anneals are typically done in the range of 200 to 400C for between 15 and 60 minutes. A method for fabricating silver or silver alloy articles and tube stock suitable for the matrix, particularly thin-walled tubes and other articles having small cross-sectional areas, is described in commonly owned application Ser. No. 08/831,504, filed Mar. 31, 1997 now U.S. Pat. No. 6,294,138 by Jeffrey M. Seuntjens and entitled "Silver and Silver Alloy Articles." This application, which is here incorporated by reference in its entirety, discloses the making of structures that are free from defects, have a fine grain size, are amenable to uniform deformation, and that can be used to make superconductor monofilaments or multifilament articles.

In the practice of the present invention it is important to insure that the superconductor product contains fine monofilaments. This is accomplished, in part, by the just-mentioned provision of a fine-grained metal matrix and annealing often enough to prevent grain growth in the noble metal. Additionally, the precursor powder is loaded into the metal tube at low density so that, after drawing (which itself does not significantly increase the density of the superconductor precursor although the diameter of the precursor filament is significantly reduced) the monofilament superconductor precursor will have a density that is in the range of about 25% to 70% (and most preferably about 40% to about 60%) of theoretical density. Also, so that the filaments will be not more than about 50 microns thick after they are rolled (and rolling, which increases the density and texturing of the filaments, may be accomplished either before or after the elements are stacked to form a multifilamentary superconductor precursor composite), the thickness of the drawn precursor element typically is not more than about 600 microns and that of the precursor monofilament in the element is not more than about 300 microns.

As previously indicated, the composite precursor stack of PIT-made elements may, as discussed above in connection with FIG. 1, be made from elements that, because they have been drawn but not rolled, have low density HTS precursor filaments. The composite may also, as in the case of composite 20 of FIG. 2, be made from elements that have been rolled into thin elements 30 such as shown in FIG. 3 after drawing (and thus typically have filaments with 80% or more theoretical density) e.g., using rolls between 2 and 5 cm in diameter. Rolling a wire having a low density filament core reduces the thickness of the wire by between 70% and 85%, e.g., a drawn round wire having a diameter of about 0.3 to 0.6 mm will be formed into an aspected element having a nominal thickness of about 0.07 to 0.10 mm and a width of about 1.5 mm. As is evident in FIG. 3, the superconductor precursor filament 32 (which remains largely in the form of a precursor powder) within the Ag sheath 34 of element 30 is generally flat along most of its width, but of reduced thickness adjacent its ends. Throughout most of the width of the element, the filament 32 has a thickness (e.g., not more than about 50 microns) that is less than two thirds, and preferably not more than half, that of the overall element.

The precursor elements (whether rolled or unrolled) are then formed into a composite stack, such as the stacks shown in FIGS. 1 and 2. As previously discussed, FIG. 2 illustrates a composite stack 40 of five precursor elements, designated 21a through 21e (each of which is typically made in the same way as just-discussed element 30), and the entire stack is wrapped with a thin (e.g., 0.04 mm×1.5 mm) Ag element 26. The manner in which the stack is formed (in a configuration similar to that shown in FIG. 1) is schematically shown in FIG. 4. As there shown, lengths of the monofilament elements 21a–28g are placed on spools, one for each element in the composite stack 20. The spools typically are mounted on a magnetic break stand to pay-off to a coplanar series of idlers. A rectangular guide 44, also mounted on the stand, collates the elements together into the stack 40. The stack formed at the downstream side of guide 44 pays off to the center of a Turks Head horizontal cabling line, generally designated 46. In the cabling line, a spool of the Ag element 42 is placed on a magnetic break-damped shaft on the rotating member of the cabling line. An idler pulley 47 and guide die 48 guide the Ag element 26 into side-by-side position in the stack, and the capstan 49 pulls the stack axially at a fixed speed relative to the rotation of the rotating member carrying the wrapping element 26 to define the desired wrap lay pitch. Preferably, the pitch is selected so that the wrapped element 42 does not overlap, and so that the gap between adjacent turns is less than the element width. The Turks Head wrapping line consolidates the stack with minimal plastic deformation of the precursor elements. The wrapped stack is then thermally bonded (e.g., at temperatures which, although above 500 C, are known not adversely to affect the precursor powder) to sinter the Ag element 42 and Ag sheath 34 of the elements 30 together, thus resulting in a multifilament precursor composite, e.g., composite 20 shown in FIG. 2 or composite 10 shown in FIG. 1, ready for final heat treatment and deformation processing. As previously discussed, it will be appreciated that the sheath 34 and element 26 may be a metal other than silver. It will be noted that the Ag wrap element 26 shown in FIG. 4 is slightly thicker (a thickness of less than about 0.003 mm is usually preferred) than typical; and the filaments in the particular elements 30 in the stack 40 shown in FIG. 4 are also somewhat thicker than is preferred for high performance.

It should also be noted that the fill factor of composite stacks 10 and 20 is typically is more than 40%, and can be much as 50% or more. This is considerably higher than the typical 25–35% fill factor range achieved for conventional HTS multifilament conductors. Also, the over-wrap element 26 may be very thin, just enough to hold the stack together until bonded in situ during heat treatment. Unlike a standard multifilament sheath, the wrap need not co-deform with the filaments during break-down and asymmetric rolling. The increased fill factor does not negatively effect the conductor stability and has benefits to increase Je and reduce cost.

The above-described technique provides improved performance simultaneously with reduced cost, providing significant savings in terms of required capital equipment, labor, processing time, labor and raw material yield; current estimates indicate an overall fifty percent cost reduction in terms of labor and raw materials. Table I, set forth below, compares the above-described procedure (at the right of the Table), starting with monofilament wire and ending with a multifilament precursor composite stack ready for final thermomechanical processing, with a standard multifilament processing procedure (at the left of the Table) The process set forth in each column starts with monofilament at one or more mm diameter cross section in coil form, and ends with a multifilament conductor ready for heat treating. As is evident, the process of the present invention requires far fewer steps.

TABLE I

| Standard multifilament PIT process | Fine element PIT assembly process |
| --- | --- |
| (Incoming monofilament coil) | (Incoming monofilament/ fine metal coil) |
| ↓ | ↓ |
| Monofilament hex Monofilament straighten and cut Monofilament clean Multifilament can preparation / cleaning | Multi-die fine wire draw with frequent anneals |
| Multifilament billet packing Multifilament billet end cap / sealing Multifilament evacuation Multifilament hot isostatic press / thermal bond Multifilament billet extrusion Multifilament large rod breakdown Wire draw to diameter for start of rolling | Roll to element (optional at this time in the process) |
| Roll to element (Multifilament composite at heat treatment) | Respool Stack Roll (Multifilament composite at heat treatment) |

Reference is now made to FIGS. 5–8 which illustrate other, and preferred, precursor components and a procedure for forming them.

Figure 5:
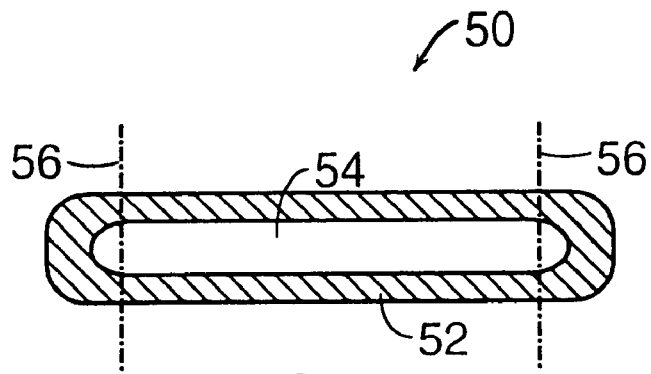
FIG. 5 is a cross-section of a monofilament precursor element made using a coated conductor technique for use in the practice of the present invention.

According to the procedure of FIGS. 5–8, the precursor elements, designated 50 in FIG. 5, are made by depositing a layer 52 of precursor powder on a fine-grained Ag or other noble metal substrate 54, typically using either a continuous electrophoretic coating technique such as that described in L. D. Woolf, et al., Appl. Phys. Let 58 (1991) 534, a slurry/dip coating technique such as described by S. E. Dorris, N. Ashcom and N. Vasanthamohan in an Argonne National Laboratory December 1996 Superconductor Development Quarterly Progress Report, or any of a number of other known procedures for depositing thick films including physical film forming methods such as sputtering or ion beam assisted deposition (IBAD; see, e.g., U.S. Pat. No. 5,079,224) and chemical film forming methods such as chemical vapor deposition (CVD; see, e.g., U.S. Pat. No. 5,231,074).

The particular technique used to form the precursor powder layer 62 on the substrate 64 is not important. Further, and as discussed previously, although BSCCO 2223 and YBCO 123 are preferred, any of a large number of other ceramic superconductor precursors, particularly members of the RBCO, BSCCO, TBSCCO and HBSCCO families of oxide superconductor precursors, may be employed.

As shown in FIG. 5, the Ag substrate 54 has a width (e.g., typically about 1500 microns) substantially equal to that of the desired precursor element 50 but is quite thin. Typically it has an aspect ratio (in transverse cross-section) of between 10:1 (e.g., a thickness of about 150 microns) and 20:1 (e.g., a thickness of about 75 microns). A precursor layer 52 is deposited on both sides, and along the side edges, of the substrate 54. After the precursor has been deposited, the edge portions of the coated element are slit (e.g., along the dashed lines 56 shown in FIG. 6) and the coated edges 58 are removed.

Although, depending on the particular deposition procedure used, the precursor layer 52 may be somewhat thicker near the edges of the element, the layer generally has essentially uniform thickness both across and along the length of the Ag substrate 54. The particular thickness chosen will depend on a variety of factors, including the particular precursor employed, the manner in which the precursor layer is formed and the resulting density of the layer, the manner in which the precursor will be thermomechanically processed, and the intended use of the end product multifilamentary superconductor. By way of example, although the thickness of the precursor layer 52 typically will be in the range of about 10 to about 100 microns, it may range from as thin as 5 to as thick as 1000 microns. In the preferred practice in which the precursor layer comprises a BSCCO-2223 precursor deposited at a density of about 40% of theoretical density, a typical thickness is about 15 to 20 microns.

Figure 6:
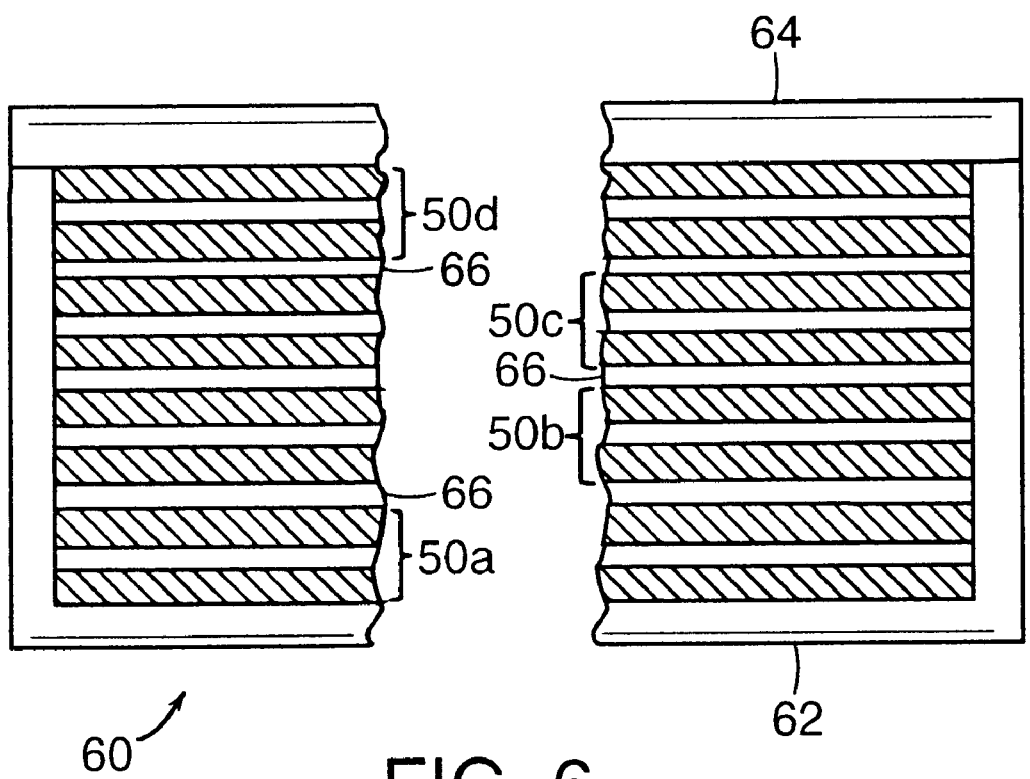
FIG. 6 is a cross-section of a composite stack including a multiplicity of the monofilament precursor elements of FIG. 5.

FIG. 6 illustrates a composite stack 60 of four elements, designated 50a through mad, positioned in a fine-grained metal, e.g., Ag, trough 62 the top of which is covered with a fine-grained metal, again typically Ag, foil 64. It will be noted that the four elements provide a total of eight filament precursors. Within the trough, the adjacent elements 50 are separate d by a total of three fine grain metal, e.g., Ag, spacer strips 66. The complete stack structure is heated (as in the case of composite 20 previously discussed to temperatures which will not adversely affect the precursor) to bond the elements, intermediate strips, trough and covering foil together. In a slightly modified procedure, an ensemble of coated precursor-Ag strip pairs may inserted into an appropriately dimensioned Ag tube, which is then heat treated to bond the components together although the quality of the thermal bond is less critical. In either procedure, the bonded eight-filament composite precursor structure 670 is ready for final heat treatment and deformation processing . It will be no ted that FIG. 6 is a broken view, and thus does not show the full width of composite 60. As previously indicated, the full width of the composite is at least as great as its full width, and typically is considerably greater.

Figure 7:
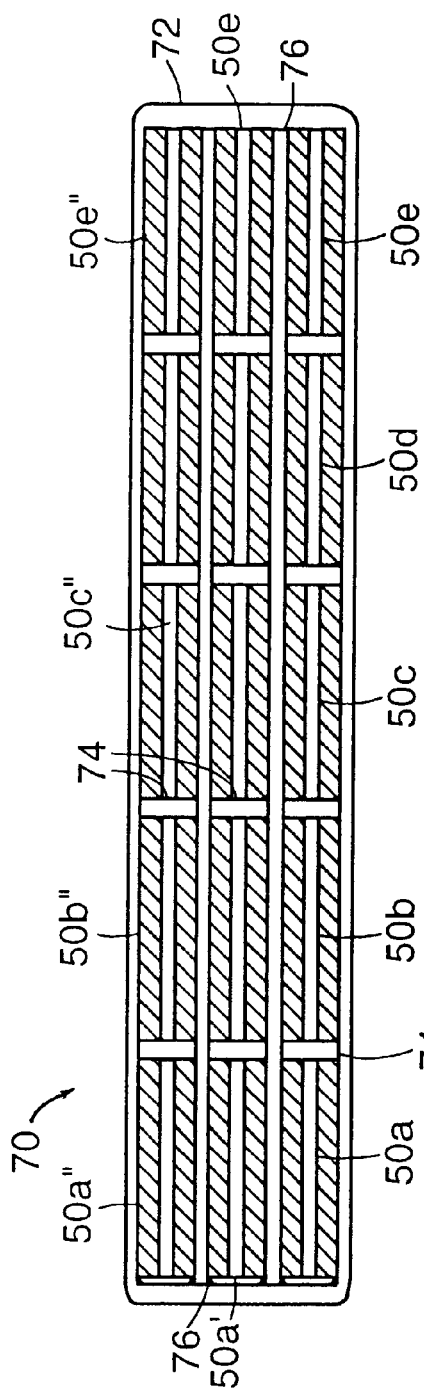
FIG. 7 is a cross-section of a second composite stack including a multiplicity of the monofilament precursor elements of FIG. 5.

FIG. 7 illustrates a composite 70 of fifteen elements, designated 50a through 50e, 50a' through 50e', and 50a" through 50e", arranged in three layers, designated 56, 56' and 56" respectively. Each layer includes five elements placed in a side-by-side configuration. The entire composite is wrapped with a metal foil layer 72. It will be noted that each element provides two precursor filaments, and that the fifteen elements thus provide a composite having a total of thirty precursor filaments; by way of comparison, a similar arrangement of elements formed by a PIT procedure would, as should be evident from the prior discussions, provide only half as many precursor filaments. In each layer of the composite 70, a metal, e.g., Ag, spacer 74 is placed between the adjacent sides of each pair of elements 50.

Figure 8:
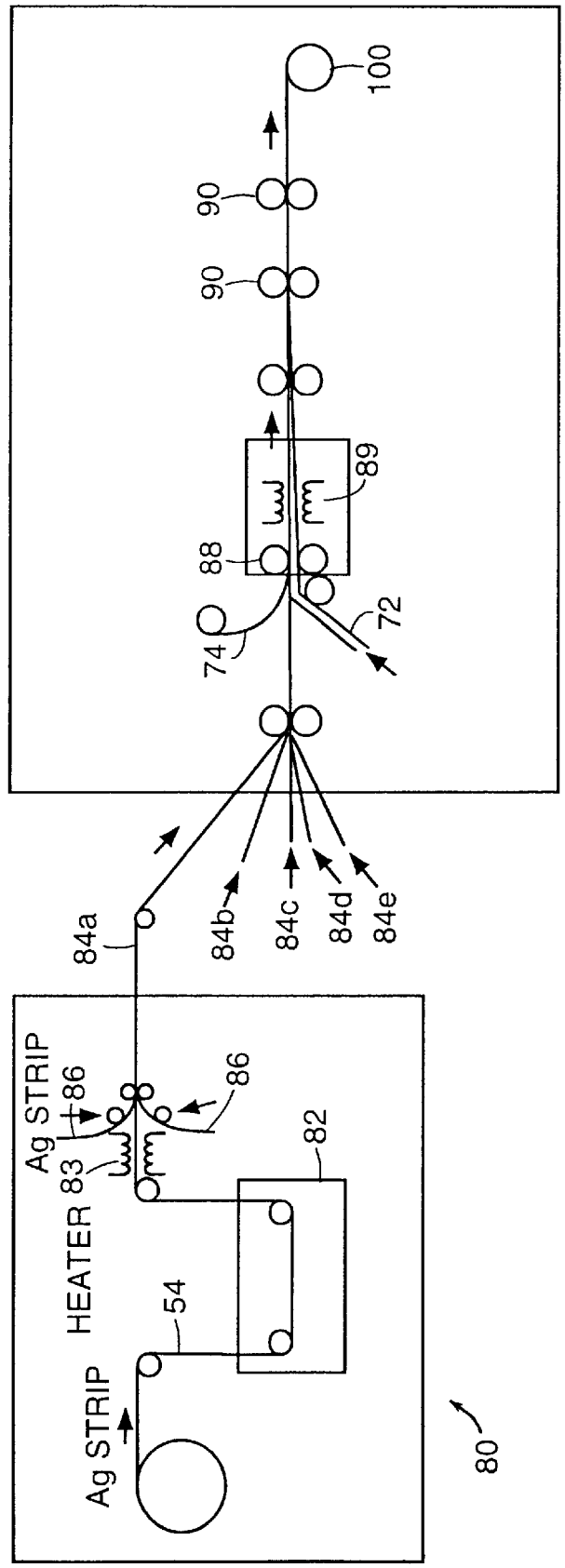
FIG. 8 is a schematic illustrating a procedure for forming the precursors of FIG. 6, and the composite structures of FIGS. 6 and 7.

Reference is now made to FIG. 8 which illustrates, somewhat schematically, a complete process for manufacturing a multifilamentary superconductor composite according to this aspect of the present invention. In general, a precursor production station, generally designated 80, is provided to make each of the desired number of individual precursor elements 50; although only one station 80 is shown, the total number of stations will of course depend on the number of elements that are used to form the complete composite. At each of the stations, a fine grain Ag substrate strip 54 is passed through a slurry bath 82 to deposit the precursor layer 52 on the substrate and form the element 50, the element is then sintered by heater 83 and, after its edge portions have been removed, a fine grain Ag spacer strip 76 is placed in position, either on one or both of the top and bottom surfaces of the element 50 in a vertical stack, or between adjacent elements 50 in a side-by-side stack. The "sandwich" 84a formed by the elements and spacers is then advanced to the composite production station 86.

At the inlet to composite production station 86, element sandwich 84a is juxtaposed with essentially identical element sandwiches 84b, 84c, 84d and 84f (it will be recognized that when the elements are vertically stacked, each element sandwich will require only a single spacer strip, on the underside of the element; when they are stacked horizontally side-by-side, a spacer is needed only between adjacent elements) and passed through grooved inlet rolls 86 which stack and align the element sandwiches. The resulting multi-element structure is then placed in a fine grain conduit trough 72, the trough 72 with the elements 50 and spacers 76 therein is covered with a fine grain foil 74, and the entire structure is then consolidated by rolls 88 and heat bonded by heater 89, thus producing the bonded multifilament composite precursor structure 70 shown in FIG. 7, ready for final heat treatment and deformation processing.

As schematically shown in FIG. 8, the precursor structure 60, 70 is thermomechanically processed, i.e., is subjected to the desired number of deformation (e.g., by rolling to impart deformation-induced texturing) and sintering (e.g., by heating to impart reaction-induced texturing) steps, to develop the desired density and degree of texture in the final multifilament superconductor, which is then wound onto a take-up roll 100. As discussed in somewhat more detail hereinafter, the other precursor composites discussed herein are similarly thermomechanically processed to produce, e.g., superconductor composites such as those shown in FIGS. 1 and 2.

Table II below compares, in somewhat more general terms than Table I previously discussed in connection with the procedure for making composite precursors using a PIT procedure, the above described coated conductor procedure for forming a multifilamentary superconductor composite with a conventional procedure for forming a multifilamentary PIT structure. As will be evident, the coated conductor composite precursor procedure, to an even greater degree than procedures according to the present invention utilizing PIT-based monofilament elements, provides significant savings.

TABLE II

| FINE ELEMENT COATED PRECURSOR | STANDARD POWDER IN TUBE |
| --- | --- |
| Prepare Slurry of HTS | Prepare HTS Powder |
| Deposit and sinter HTS on Ag Substrate | Pack HTS Powder in Ag Tube |
|  | Draw Wire (more than 10 passes) |
| Wrap HTS coated elements | Restack Multiple Wires into Tube |
| Consolidate | Draw Multifilamentary Wire to Smaller Diameter (more than 10 passes) |
| Roll Composite (1–5 Passes) | Roll Composite (1–5 passes) |

It should be particularly noted that the deposited/coated conductor procedure shown in FIG. 8 permits a substantially continuous manufacturing procedure, starting with rolls of the fine grain Ag or other metal substrate used for the individual elements 64, and ending with a reacted composite multifilamentary superconductor composite. Additionally, and largely because the composite structure 70 formed using these deposited or coated conductor techniques are not drawn but are only rolled, the high silver (or other metal) content required to support the draw loads and forces employed in PIT procedures is not required. As a result, the substrates 64 and conduit trough 72 can be quite thin, and the total amount of silver silver or other metal used in the product significantly reduced. This permits further increase in the fill factor, which typically is about 30% and may be as high as 40% or more.

No matter what type of precursor element is employed, it will be apparent that the process of the present invention also allows a manufacturer to choose a composite Ic by varying the number of strands assembled in the composite. This offers great flexibility to the manufacturer, since only one type of strand (monofilament) needs to be inventoried to be responsive to a wide variety of commercial conductor needs. It also allows for composites with different Ic's to be fabricated from common strands and similar strand deformation paths. By way of comparison, in standard multifilament composite processes, the manufacture must have several different multifilament billet configurations, developed for different applications, and must maintain inventories of various multifilament composites at intermediate or final processing stages. To change the Jc in a conventional process, one or more of the billet size, monofilament restack size, filament count and multifilament design, or total multifilament strain, must be varied. According to the preset invention, substantially all of this may be accomplished simply by varying the manner in which common strands are stacked in composites and thereafter deformed and heat treated.

As an example, a conductor Jc requirement may be 140A minimum for the composite cable. Due to winding requirements in the application, the maximum composite thickness may be 0.2 mm, noninclusive of any lamination material. The optimal monofilament strand dimension may be nominally 0.1 mm thick and 1.5 mm wide and the reproducible, long-length Je level may be 12,000 A/cm$^2$. For these dimensions, this Je level equates to an Ic of 18 A/strand in the composite. Therefore, a configuration of 4 strands wide by 2 strands thick yields an Ic of 144A in a nominal 0.2×6 mm cross-section, not including strengthening members.

In such a conductor, in which the precursor elements from which the composite conductor is made are placed in a both horizontally and vertically stacked configuration, the elements typically will be stacked in the manner previously adverted to in connection with the FIGS. 1 and 2, i.e., each horizontal row or layer of elements will be positioned so that the filaments of the elements in the different rows are vertically aligned. It is also possible to provide a configuration in which, similar to the placement of bricks in a brick wall, the filaments in the elements in the different rows are not all vertically aligned. A stack in which the elements are arranged in such a "brick wall" configuration provides greater stability and permits the stack to have a higher aspect ratio than is usually otherwise desirable.

Figure 9:
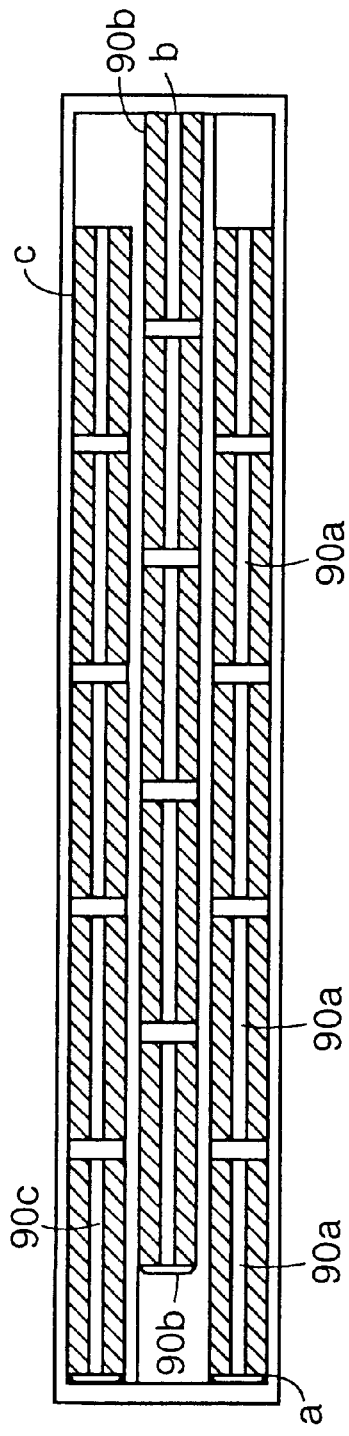
FIG. 9 is a cross section of another superconductor precursor structure.

FIG. 9 illustrates such an alternative arrangement. The composite 90 of FIG. 9 includes a total of fifteen (15) precursor elements 92, each of which is substantially the same as an element 30 in FIG. 3, although it will be recognized that elements such as those shown in FIGS. 1, 6 or 7 may be used also. The elements 92 are arranged in three vertically stacked layers, designated layers a through c respectively, although it will be recognized that a stack including more than three layers may also be used. As shown, each layer includes five precursor elements 92 arranged in a side-by-side configuration similar to that of the elements in the composite 10 of FIG. 1. The respective elements 92a in layer a and 92c in layer c are vertically aligned with each other. The elements 92b in layer b are offset relative to elements 92a and 92c. That is, the elements in the various layers of the precursor composite are positioned so that the precursor HTS filaments in different vertically spaced layers are either substantially vertically aligned with each other (as are the filaments in layers a and c) or the adjacent layers are positioned such that the center of the relative thin space between adjacent filaments in a layer (i.e., the thin metal sheath or spacer between monofilaments) is placed in vertical alignment (above or below as the case may be) with the center of the filaments in the adjacent layers; e.g., the Ag between adjacent filaments in layer b is aligned with the centers of the filaments in layers a and c, and visa versa.

As discussed in aforementioned application Ser. No. 08/468,089, there are a number of known procedures for the thermomechanical processing of superconductor precursors; these typically involves repeated steps of deforming and sintering, at varying pressures and temperatures depending on the particular employed. These processes are often designated by the term "nDS", in which "D" refers to the deformation step, "S" refers to the sintering or heating step, and "n" refers to the number of times the repetitive process of deformation and sintering are carried out. Typical prior art processes are 2DS and 3DS processes.

Although the particular thermomechanical processing procedure is not critical to the practice of the present invention, the preferred practice is to use a deformation/sintering iteration process that uses as few iterations as possible, i.e., a 1DS process such as described in the '089 application, or if that cannot be done a 2DS process. In the preferred 1DS practice, the bonded multifilament composite precursor structure, e.g., a composite of low-density monofilaments produced using PIT procedures or a composite of low density monofilaments made using coated conductor procedures, is roll worked in a high reduction draft in the range of about 40% to 95% in thickness. There is no further reduction in thickness in excess of about 5% after the high reduction draft step and prior to a sintering step, and the thus-rolled composite structure is then intered to obtain the final oxide superconductor composite multifilamentary product. Similar reductions in thickness are achieved using a 2DS practice. If the composite is made of monofilament elements which have been rolled, and thus have a high rather than a low density before they are formed into a composite, subsequent thermomechanical processing of the composite will result in a much smaller reduction in thickness. However, and no matter what types of precursor elements are employed, the present invention permits the processing of the individual precursor elements to be decoupled from, and to be accomplished in a manner that is largely independent of, later processing of the consolidated multi-element precursor composite.

Figure 10:
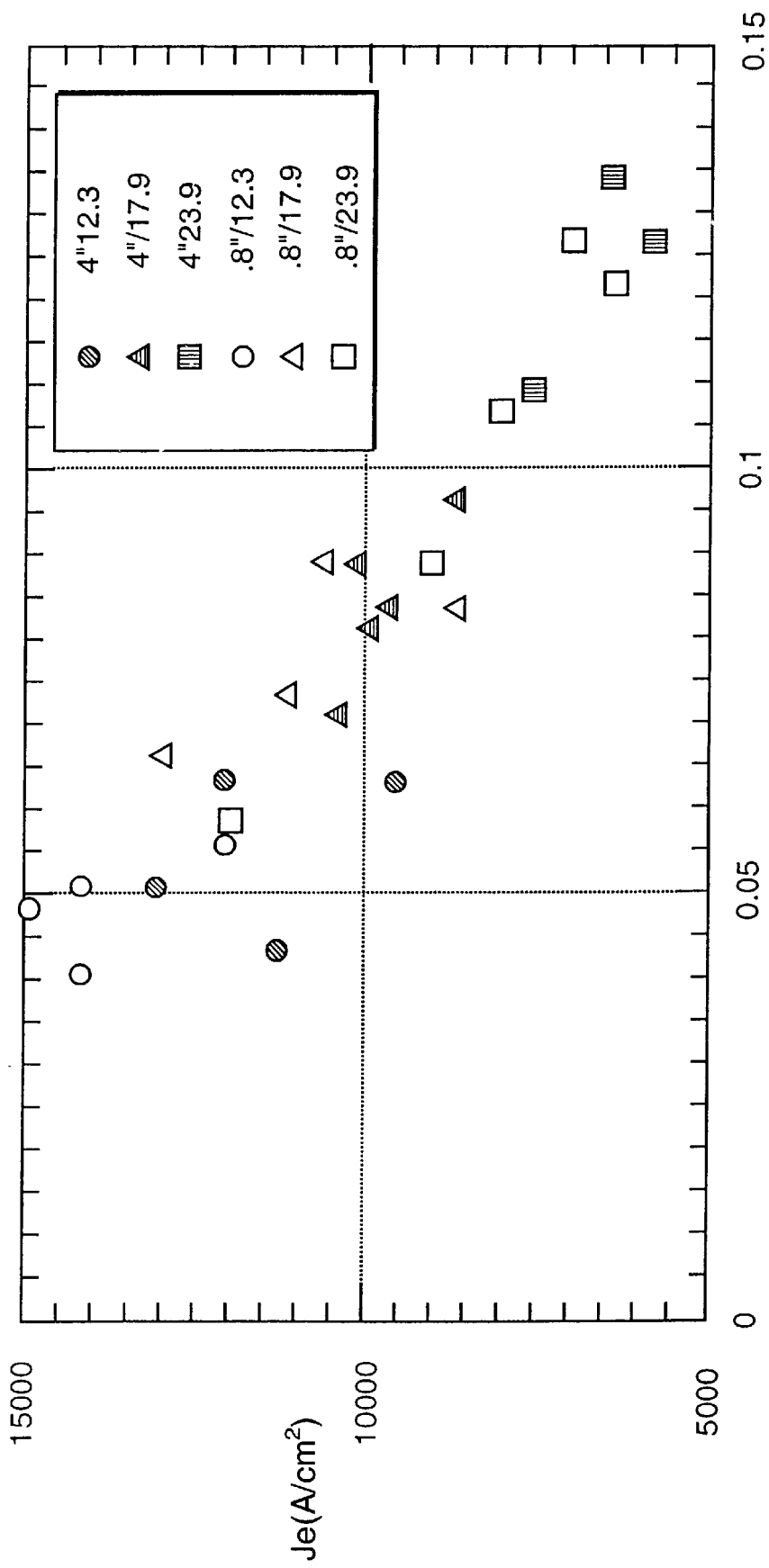
FIGS. 10 and 11 are graphs illustrating the relationship between filament thickness and Je (engineering current density over the cross-section of the entire superconductor including both HTS and other structure).
Figure 11:
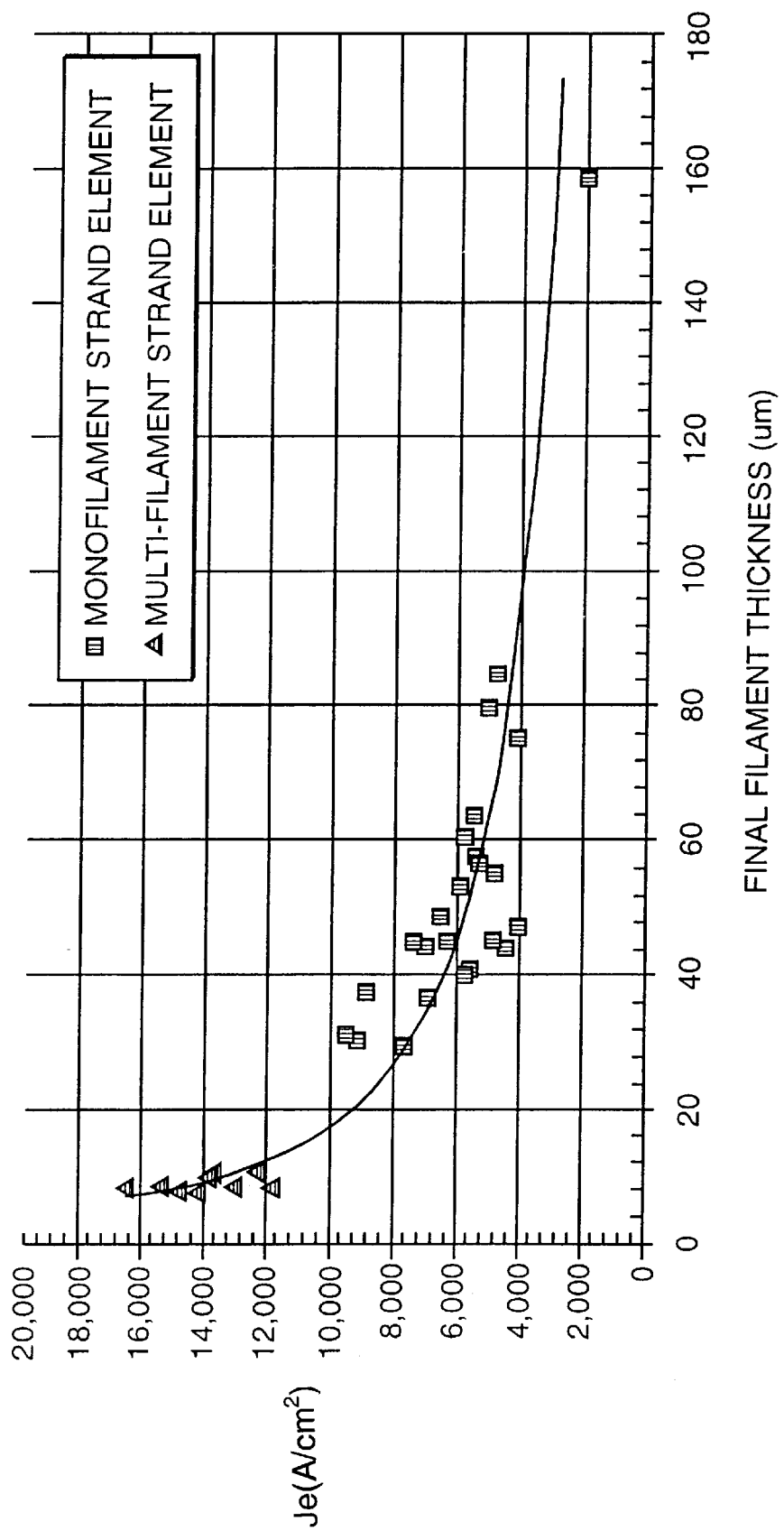

Used with superconductor precursor composite in which the monofilament superconductor precursors have a low density, such a single high draft deformation greatly decreases the thickness of the superconductor precursor in the composite 40, 70, e.g., to a thickness of 1 to 3 microns, and in combination with the sintering step also increases the density to as much as 95% theoretical density. As shown in the graphs of FIGS. 10 and 11, discussed in more detail below and which show the relationship between Jc and filament thickness, the Jc of a superconductor filament is highly dependent on filament thickness; all else being equal, a thinner filament will have a far greater Jc than a thicker one. In large measure because the present invention enables the production of composite structures with very thin (e.g., less than 3 microns thick) monofilaments, it is anticipated that BSCCO-2223 composite structures made according to the present invention will achieve Jc levels in excess of 100,000 A/cm$^2$ (77K, 0 T)

In the preferred practice of the invention, the superconductor precursor composite is constrained during rolling by positioning it between two elongated constraining members in contact therewith on opposite sides of the superconductor precursor composite. The composite, together with the two constraining members in contact therewith, is passed through rollers to form a textured superconductor composite. The rolling assembly for single-pass rolling of a precursor superconductor composite tape includes first and second rolls and two constraining members. The first roll is aligned to rotate about a first axis, and the second groove roll is aligned to rotate about a second axis parallel to the first axis. The rolls are spaced apart a selected distance to form a passage therebetween. The two constraining members have mechanical properties similar to that of the precursor superconductor composite and are placed in contact with the precursor superconductor wire on opposite sides of the precursor superconductor when the precursor superconductor composite is passed through the rollers to form the textured superconductor composite. A fixture for feeding the precursor superconductor composite and the constraining members between the first and second rolls includes a slot dimensioned to receive the precursor superconductor composite and the constraining members. The fixture includes a tapered surface for guiding the precursor superconductor composite and the constraining members between the first and second rolls.

Constrained rolling permits deformation with large area reduction while improving the filament quality as compared to other deformation techniques. Constrained rolling particularly facilitates the texturing of superconductor composites which are sensitive to cracking and/or shearing during deformation, and provides increased dimensional control over that of other techniques. The procedure is described with more particularity in commonly owned, co-pending applications Ser. Nos. 08/902,587, now abandoned, and 08/902,588 now U.S. Pat. No. 6,001,777, both filed by DeMoranville et al. on the same day as this application and respectively entitled "Constrained Rolling and Superconductor Wire Formed Thereby" and "Constrained Rolling and Textured Superconductor Wire Formed Thereby"; both such applications are hereby incorporated by reference in their entirety.

EXAMPLE I

To examine the relationship between thickness and Jc for monofilaments made using a PIT procedure, monofilament BSSCO-2223 wire made with a fine grain silver tube manufactured in accordance with the "Silver and Silver Alloy Articles" patent application referred to above was drawn to nominally 0.6, 0.45 and 0.3 cm diameter and annealed at 300C for 30 minutes at strain increments less than 1.0 to recrystallize the Ag sheath. Rolling studies using 2 and 10 cm diameter rolls were performed to various thickness reductions from about 70% to about 90%. FIG. 10 in which the legend for the symbols defines the roll diameter/ monofilament wire diameter in inches, shows the result of the study. The Je results on the 2 and 10 cm rolls correlate to the filament thickness, despite the different widths caused by the different roll diameters. Je as high as 14,500 A/cm$^2$ were obtained.

EXAMPLE II

As part of a program directed to the development of cables, the relationship between the final thickness of the superconductor filaments in the cable and the Jc of the filaments was examined. FIG. 11 is a graph of Je (77K, self field, 1 microvolt/cm) vs. filament (both monofilament strand and multifilament strand) thickness. As with Example I, Je was shown to be highly dependent on, and greatly to increase with decreases in, filament thickness.

EXAMPLE III

Using a non-optimized Bi-2223 powder, a coated element precursor was fabricated using electrophoretic deposition. The thickness of the Bi-2223 precursor was about 20 microns with good dimensional uniformity across the width and along the length of the fine grain Ag strip. The density of the precursor was estimated to be ~40% theoretical. Twenty 12" lengths of the coated precursor were assembled and stacked them on top of each other, separating each one with fine grain Ag strip. This multifilamentary stack was then placed into a rectangular fine grain Ag trough, covered with fine grain Ag strip and heated to diffusion bond the elements of the composite to each other. The composite was then rolled to achieve a high level of density and texture within the ceramic filaments. The filaments had thicknesses in the 1 to 5 micron range. In a first set of heat treatments, a Jc value of 20,000 A/cm$^2$ (77 K, 0 T) was achieved.

EXAMPLE IV

The effects of densification on a composite including approximately 15 micron thick HTS layers (density substantially equal to 30% theoretical) on opposite sides of a silver alloy substrate approximately 75 microns thick were calculated. If all deformation of such a composite during subsequent thermomechanical processing is densification, the thickness of the HTS layers will be reduced to approximately 5 microns.

EXAMPLE V

An eighteen (18) filament ultrafine HTS filament composite, having BSCCO-2223 superconductor filaments and fine grain AG substrate and spacers, was made using a coated conductor process generally as discussed above with reference to FIGS. 6–8. The composite had a Jc of 20,000 A/cm2 and an Ic of 20 A (77K, 0 T).

EXAMPLE VI

Square monofilament elements including fine grain silver were fabricated using drawing to 0.0239". To achieve finer filament dimensions, the element was subsequently Turk's Headed to 0.018" square. Eleven elements were aligned consistent with FIG. 1 and consolidated using a thermal process. The consolidated precursor was rolled in one pass using side constraining wires of 0.021" resulting in thin HFTS filaments (0.50 microns). The Jc of this material was 6,700 A/cm2 (77, sf).

EXAMPLE VII

The same procedure was followed as in Example VI, except drawing was used to fabricate 0.018" square elements. The Jc was 7,500 A/cm2.

EXAMPLE VIII

The same procedure was followed as in Example VII as Example VII except consolidation was carried out using a thermomechanical process that included drawing and thermal treatments.

EXAMPLE IX

Rectangular monofilament elements were fabricated using drawing, and the elements were aligned consistent with FIG. 2 and consolidated using a thermomechanical process that included drawing and thermal treatments. The consolidated precursor was rolled in one pass resulting in thin HTS filaments (m10 microns). The Jc of this material was 42,000 A/cm2 (77, SF).

EXAMPLE X

The same procedure was followed as in Example IX, except consolidation was carried out using a mechanical process that included drawing. Anneal temperatures were kept less than 300C.

EXAMPLE XI

The same procedure was followed as in Example X, except consolidation was carried out using a heat treatment at 785C in 0.075 atm O2 for 1 h.

EXAMPLE XII

A coated precursor was fabricated by dip coating a buffered (YSZ) fine grained Ni substrate with YBCO. The coated precursor element was calcined giving a coating density less than 70%. Two precursor elements were stacked according to FIG. 2 and wrapped with an Ag alloy. The precursor composite was consolidated using a thermal process.

EXAMPLE XIII

Lengths of rolled monofilament tapes were placed on spools, one for each strand in the stack. These spools were mounted on a magnetic break stand to pay-off to a co-planer series of idlers. A rectangular guide, also mounted on the stand, collated the tapes together into stack. The stack of tape strands paid-off through the die to the center of the horizontal cabling line, which was set up to over-wrap the stack. A spool of think (0.05 mm) fine Ag tape was placed on a magnetic break-damped shaft on the rotating member. An idler puller guided the Ag foil wrap onto the stack. The capstan pulled the stack fixed ratio to the wrap rotation to define a fixed wrap lay pitch.

The Ag wrap material was made by rolling annealed Ag wire under high tension. The wrap material was typically 0.04 mm×1.5 mm cross section. Reconfiguration of the horizontal cabling line to a wrapping line was straightforward.

Figure 12:
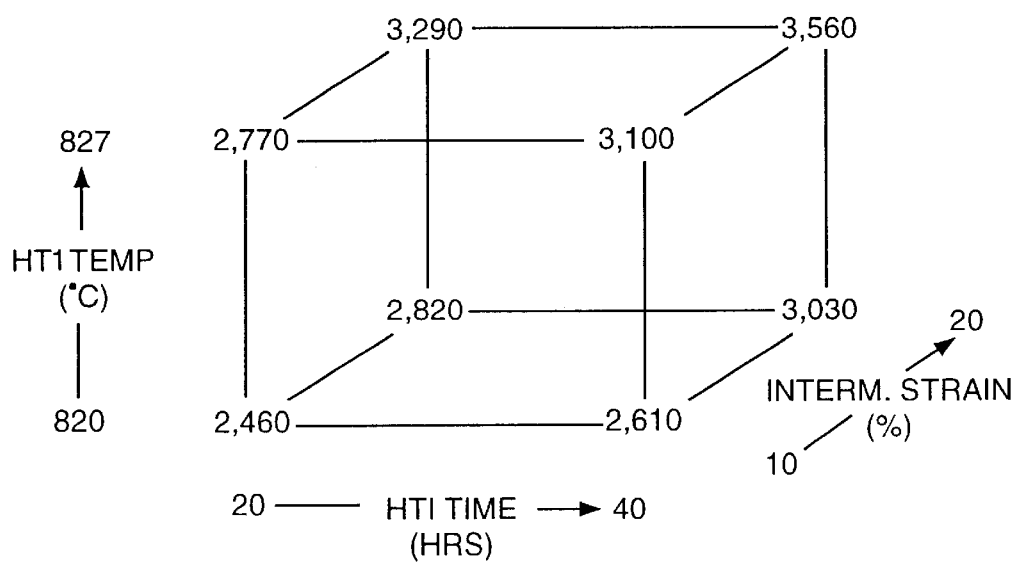
FIG. 12 illustrates Je data.

The system was configured for 7 monofilament tapes and the line ran without incident. The monofilament tape back-tension was adjusted to be just high enough to fabricate a tight wrap (~0.7N). The first run was not optimal in that the wrap was 0.05 mm thick and was placed with nominally a 50% gap between turns of the wrap. Due to the higher than optimal wrap thickness, the wrap remained oval shaped in the product. The wrap could be consolidated by turk head with minimal plastic deformation on the monofilament tapes. Short lengths of the stack cable were used in a mini optimization study investigating the first heat treatment (HT1) conditions and intermediate strain for a fixed final heat treatment. FIG. 12, which is a 3-D plot, shows the optimization variables: HT1 time (20 and 40 hr.), HT1 temperature (820° and 827° C.), and intermediate rolling strain (10% and 20%) make up the three axis. The corners of the cube contain the final Je data for the appropriate condition.

Figure 13:
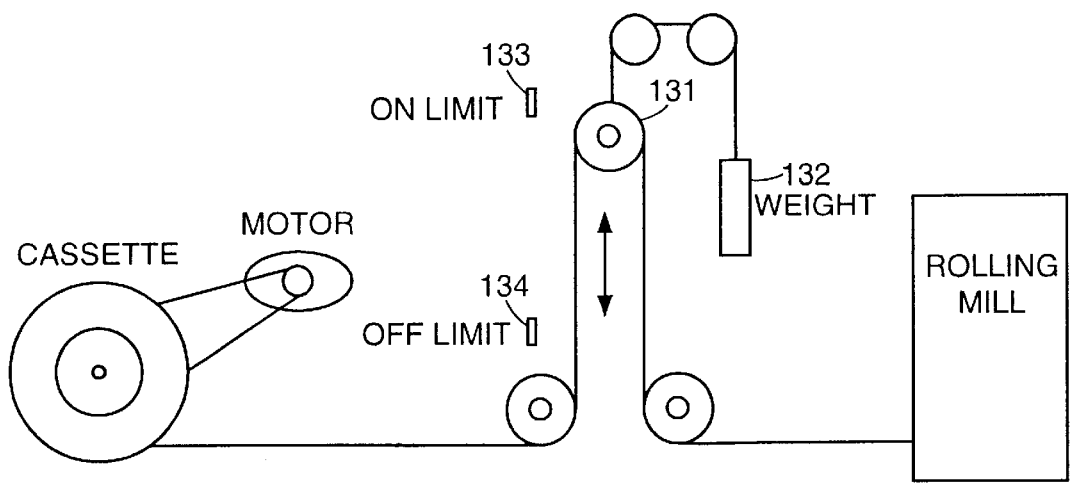
FIG. 13 illustrates a tension take-up system.

An automated dancer-cassette take-up system was built to provide for take-up with uniform and low tension. As shown schematically in FIG. 13, the system consists of a moving pulley 131 on linear bearings connected to dead-weight, 132 and a motorized drive. The motor drive is controlled by limit switches 133, 134 at the top and bottom of the pulley travel. The cassette take-up eliminates hard-way bends in the tape due to spool traverse and has a large hub diameter to minimize bend strain. The unit is mounted on a cart for potential use with any rolling mill.

The respooling process and the pay-off path on the stacking line were also modified to reduce bend strain. The Ag wrap thickness was reduced to 0.03 mm to reduce the need for back-tension during the stacking process to obtain a tight wrap.

A multistrand superconductor was made with these improvements. The rolling mill take-up system worked well at loans of 0.98N on the tapes (200 g mass load on the moving pulley) at speeds over 5 m/min. It is thought that the machine is capable of 0.24N tension at high speeds. Monofilament samples taken from the take-up cassette did not show transverse cracking. The Je levels of these sample achieved 5000 A/cm$^2$ at 77K in self field.

It will be recognized that the structures of the superconductor precursor monofilaments and of the superconductor precursor composites are important to the practice of the present invention. For the final superconductor product to have the desired high performance, each of its superconductor filaments should be of essentially fine and uniform dimensions, preferably substantially rectangular, and it is also highly desirable that the dimensions and characteristics of different filaments in the multi-filamentary product themselves be essentially the same. According to the present invention, this is accomplished by providing precursor elements that have substantially the same fine dimensions and characteristics, and then assembling the elements into rectangular (including square) in transverse cross-section composite stacks. The configuration of the stack relative to the deformation forces insures that during subsequent thermomechanically processing, when the stack is passed between a pair of rolls or the like that apply force generally vertically (i.e., perpendicular to the width and parallel to the height) of the composite stack, each filament in the stack will be subjected to substantially similar deformation processing thus providing a multifilamentary superconductor in which the all of the filaments have the desired, and substantially the same, superconducting properties. In addition, the principal axes of the precursor filaments and the stacks should be parallel to those of the precursor and product. As previously indicated, superconductor precursor monofilaments are arranged in the composite stacks with the filaments aligned and the tops and bottoms of the filaments generally parallel; and a metal layer is provided between each pair of filaments and, typically, surrounding the exterior of the entire composite stack. The metal layer may be provided by, e.g., an Ag sheath 34, an Ag substrate 64, Ag wrap 42, trough 70, foil 74 and/or a spacer strip.

As previously discussed, the precursor elements may be stacked in a single vertical (as shown in FIGS. 2 and 6), or a single horizontal (as shown in FIG. 1) row. A number of vertical stacks also may be placed side by side, e.g., to produce an arrangement in which the filaments are relatively located as shown in FIG. 7, or a number of horizontal side-by-stacks may be placed one on top of the other to provide structures such as those shown in FIGS. 7 and 9. In each event, it will be noted that the filaments of the composite are located so that, when pressure is applied in a generally vertical direction during later thermomechanical processing, each filament will be subjected to substantially the same forces and deformation. It will also be noted, as discussed above, that the width of each composite is no less than the composite height to insure stability during subsequent processing.

No matter what particular precursor is employed, the following criteria are important for high performance:

1. Appropriate Dimensions—The filament dimensions should be generally uniform throughout the composite. This requires the filaments in the superconductor precursor elements similarly to have generally uniform dimensions (both within any particular element and from one element to another) and further HTS filaments in the final product to have a high aspect ratio. The particular dimensions of a particular precursor will, of course, depend on such things as overall structure of the precursor composite and the particular nDS procedure used to thermomechanically process the precursor composite. Typically, an unrolled precursor element will be between 25 and 1250 microns thick, preferably between 30 and 600 microns thick, and, in most preferred embodiments, between 30 and 250 microns thick. The width of the precursor composite may vary widely. Although it is always desirable that the composite width be at least as great as the height, it may also be many times wider, e.g., the overall width may be as much as 25000 microns and in many circumstances will be 2500 microns or more. As discussed above, the thickness of the metal, typically Ag, layers in the precursor elements and precursor composites is less critical; typically thicker layers are needed in elements used in PIT procedures for reasons previously discussed.

2. Density—Before rolling, the density of the precursor filaments should be low, in the range of about 25% to about 70%, preferably in the range of 30% to 65% and, particularly when the precursor filaments of the precursor elements are made using a deposition/coating procedure in the range of 35% to 60%. Providing a low density precursor filament with a low degree of texturing optimizes characteristics of the superconductor filaments produced during subsequent thermomechanical processing.

3. Thickness—The precursor monofilaments should be thin. After rolling in a PIT process, a precursor filament should not be more than about 50 microns thick. Deposited superconductor precursors may be significantly thinner. In particular, for high performance, each superconductor filament in the final product should not be more than about 10 microns thick (and preferably 2–7 microns thick), although as discussed above thicker filaments (e.g., not over 50 and preferably not more than 40 microns thick) may be used in appropriate circumstances)). The width of the final superconductor structure will typically be such greater than the thickness of any HTS filament.

4. Dimensional Uniformity—Both the precursor filaments and precursor elements should be substantially rectangular and generally uniform along the length of the precursor, as well as generally uniform across the width of the filament and element. In particular, the principal axes of the filaments and the precursor stacks should be parallel to those of the precursor and product.

5. Fill Factor—Precursor elements, particularly those made using a deposition/coating process rather than with a power-in-tube technique, typically include a high percentage of superconductor precursor filament relative to the amount of noble metal. This leads to a higher fill factor in both the composite precursor and in the final superconductor composite. The achievable fill factor is further increased because the composite precursor requires less noble metal, typically Ag, fill than a conventional multifilamentary cable and, to an even greater degree, in the case of deposition/coated precursor elements, because the amount of noble metal required for structural support during drawing is greatly decreased.

6. The metal component, e.g., the sheath, spacer and/or foils, should be a fine grained deformable metal at least through the stacking step. As discussed above, the metal should be annealed frequently during drawing under conditions selected to maintain the fine grain size. Fine grain metals are required for fabrication of high performance superconducting elements because they allow the formation of the fine filament sizes associated with high Jc. In PIT processes, they allow the fabrication of fine, uniform tubes that encase the precursor powder. In coated conductor processes, fine grain metals are needed to make uniform and fine dimension substrates for improved fill factors.

The manner in which the precursor composite is constructed using the monofilament precursor elements is also important. Important criteria include:

1. Forming and arranging the elements relative to each other so that every monofilament in the multifilament composite can be subjected to substantially the same pressure/deformation conditions during later thermomechanical processing.

2. Insuring that a fine grain metal, e.g., a noble metal such as silver, layer is provided between adjacent HTS filaments. The thickness of this layer is controlled so that it is not significantly greater than required to provide sufficient structural integrity during processing.

3. Insuring that the configurations of both the individual elements and that of the composite provide a high fill factor. This is a function of both the relative metal/HTS material in the individual elements, and the extent to which any additional metal is used in forming the composite. The precursor elements of the present invention, particularly those made using a deposition/coating process rather than with a power-in-tube technique, typically include a high percentage of superconductor precursor filament relative to the amount of metal. This leads to a higher fill factor in both the composite precursor and in the final superconductor composite. The achievable fill factor is further increased because the composite precursor requires less metal, typically Ag, fill than a conventional multifilamentary cable and, to an even greater degree, in the case of deposition/coated precursor elements, because the amount of metal required for structural support during drawing is greatly decreased.

It also is often desirable that the precursor composite, often after appropriate treatment after the composite is formed but before thermomechanical processing, have a relatively low volatile content so that blisters and other defects do not form during heat treating.

It will be apparent to those skilled in the art that the methods and advantages of the present invention are capable of being used in multifilamentary superconducting articles having a variety of configurations and compositions, including both superconductor precursors and superconducting ceramics now known and preferred and those that will be hereafter discovered and developed. The invention is not intended to be limited by any of the particular description and examples set forth above, which are set forth in the specification for purposes of illustration only, and other structures, methods and embodiments will be within the scope of the claims.

What is claimed is:

1. A multifilamentary high temperature superconductor precursor composite comprising a plurality of precursor elements arranged in horizontal or vertical alignment with each other, each of the elements including an HTS (high temperature superconductor) precursor monofilament, each of the monofilaments having a density in the range of about 30% to about 70% theoretical density, the superconductor precursor composite including fine grain metal components surrounding each of the monofilamentary HTS precursors, and said elements are consolidated.

2. The composite of claim 1 wherein said monofilaments have a lower degree of texturing than monofilaments of a superconductor formed therefrom.

3. The composite of claim 1 wherein said density is less than about 60% theoretical density.

4. A multifilamentary high temperature superconductor precursor composite comprising a plurality of precursor elements arranged in horizontal or vertical alignment with each other, each of the elements including an HTS (high temperature superconductor) precursor monofilament surrounded by fine grain metal components, each of the monofilaments having in transverse cross section a width that is greater than the thickness thereof and the thickness thereof being not more than about 50 microns.

5. The composite of claim 1 or claim 4 wherein a plurality of said precursor elements are arranged in a layer extending transversely the width of said precursor composite with the elements in the layer substantially aligned with each other across the width of said composite, said composite including said fine grain metal components interposed between adjacent side edges of each pair of adjacent HTS precursor monofilaments in said layer.

6. The composite of claim 5 wherein said layer includes at least five of said HTS precursor monofilaments.

7. The composite of claim 6 wherein said layer includes at least 5 of said precursor elements.

8. The composite of claim 1 wherein each of said elements includes only one said monofilament.

9. The composite of claim 1 wherein each of said elements includes two said monofilaments.

10. The composite of claim 1 wherein the width of each monofilament is at least as great as the height thereof.

11. The composite of claim 5 including a plurality of said layers positioned one above the other with the elements in each of said layers oriented relative to the elements in each of all of the other layers such that all of the HTS precursor monofilaments are symmetrically arranged in said composite.

12. The composite of claim 11 wherein the elements in each of said layers are arranged such that the HTS precursor monofilaments in each of said layers are one of (i) vertically aligned with, and (ii) have a center in vertical alignment with an edge of, the HTS precursor monofilaments in other layers.

13. The composite of claim 11 wherein each of said monofilaments has a width greater than the thickness thereof, and wherein the elements in each of said layers are oriented with their wide dimensions parallel to each other and to the transverse width of the composite.

14. The composite of claim 11 wherein each of said monofilaments has a width greater than the thickness thereof, and wherein a plurality of said precursor elements are arranged vertically with the monofilaments thereof substantially vertically aligned with each other, said composite including said fine grain metal components interposed between adjacent ones of said monofilaments and the overall width of said composite being not less than the overall height of said composite.

15. The composite of claim 14 including at least five of said vertically arranged elements.

16. The composite of claim 14 wherein each of said elements includes not more than two of said precursor monofilaments.

17. The composite of claim 1 wherein each of said monofilaments has in transverse cross section a width that is greater than the thickness thereof, and the thickness thereof is not more than 50 microns.

18. The composite of claim 1 wherein said metal is a noble metal.

19. A multifilamentary high temperature superconductor precursor composite comprising a plurality of consolidated precursor elements arranged in horizontal or vertical alignment with each other, each of said precursor elements including a metal substrate and an HTS (high temperature superconductor) precursor layer deposited on at least one face of said substrate, said HTS precursor layer having a density in the range of about 30% to about 70% theoretical density, and said composite including fine grain metal between adjacent precursor elements.

20. The composite of claim 19 wherein each of said precursor elements includes a said metal substrate and a said HTS precursor layer deposited on two opposite faces of said substrate.

21. The composite of claim 20 wherein the metal substrate is exposed at side edges of each of said precursor elements.

22. The superconductor precursor of claim 19 wherein said metal substrate is Ag or an Ag alloy.

23. A process for making a multifilamentary high temperature superconductor from a plurality of precursor elements arranged in horizontal or vertical alignment with each other, said process comprising the steps of:

providing a plurality of said precursor elements, each of said elements including an HTS precursor monofilament, stacking said plurality of said precursor elements relative to each other such that said monofilaments are aligned with each other, and said plurality of said precursor elements are surrounded by fine grain metal components, consolidating said stacked elements, and thermomechanically processing said stacked elements to provide a multifilamentary superconductor comprising a plurality of HTS monofilaments each of which has a thickness that is not more that about 50 microns.

24. The process of claim 23 including wherein each of said monofilaments of said precursor elements has a width that is greater than the height thereof, and said monofilaments are arranged in a composite with the width thereof extending transversally of said composite.

25. The process of claim 24 wherein each of said precursor elements includes an additional metal component adjacent a monofilament thereof, and including the steps of drawing said precursor elements prior to said stacking, and of annealing said elements a plurality of times during said drawing under conditions to maintain fine grain in said metal.

26. The process of claim 25 wherein said annealing is performed when strain in said elements is less than one.

27. The process of claim 24 including the step of rolling said precursor elements prior to said stacking.

28. The process of claim 23 wherein each of said HTS monofilaments has a thickness that is not more than about 10 microns.

29. The process of claim 23 including the step of depositing at least one layer of an HTS superconductor precursor on a metal substrate to provide a said element.

30. The process of claim 29 including the steps of depositing a layer of an HTS superconductor precursor on opposite sides of a said metal substrate to provide a said element, and arranging a plurality of said thus-produced elements adjacent to each other with a metal layer between each pair of said superconductor precursor layers.

31. The process of claim 30 wherein a plurality of said thus-produced elements are arranged in vertical alignment with each other.

32. The process of claim 23 wherein each of said elements is made using a PIT procedure, and comprises a low density HTS precursor filament, having a density in the range of about 25% to about 70% theoretical density, within a metal sheath, and including the steps of drawing said precursor elements prior to said stacking, and of annealing said elements a plurality of times during said drawing.

33. The process of claim 23 wherein each of said HTS precursor monofilaments has a density in the range of about 30% to about 70% theoretical density.

34. A process for making a multifilamentary high temperature superconductor from a plurality of precursor elements arranged in horizontal or vertical alignment with each other, said process comprising the steps of:

providing a plurality of said precursor elements, each of said elements including an HTS precursor monofilament, arranging said plurality of said precursor elements relative to each other in a composite such that said monofilaments are aligned with each other, and said elements are arranged in a layer extending transversely the width of said composite with said elements substantially aligned with each other across the width of said composite, a metal component being interposed between adjacent ones of said HTS precursor monofilaments in said layer, said plurality of said precursor elements being surrounded by fine grain metal components, consolidating said elements, and thermomechanically processing said elements to provide a multifilamentary superconductor comprising a plurality of HTS monofilaments each of which has a thickness that is not more that about 50 microns.

35. A process for making a multifilamentary high temperature superconductor comprising a plurality of monofilamentary superconductor monofilaments arranged in horizontal or vertical alignment with each other, said process comprising the steps of:

providing a plurality of precursor elements, each of said elements including an HTS precursor monofilament, and each of the monofilament precursors having a density in the range of about 30% to about 70% theoretical density and having a lower degree of pre-texturing than said superconductor monofilaments;

stacking said plurality of said precursor elements relative to each other so that said monofilaments are aligned with each other; and thermomechanically processing said stacked elements to reduce each of said precursor monofilaments to a thickness that is not more than about 50 microns to convert said precursor monofilaments to said superconductor filaments.

36. The process of claim 35 further including the step of consolidating said elements into a composite after stacking said elements and wherein each of the HTS precursor monofilaments of each of the precursor elements in the composite has in transverse cross-section a width at least twice the thickness thereof, and said composite has a height that is not greater than the width thereof.

* * * * *